(12) United States Patent
Greither

(10) Patent No.: US 10,770,896 B2
(45) Date of Patent: Sep. 8, 2020

(54) SOLID STATE POWER CONTROLLER

(71) Applicant: HS Elektronik Systeme GmbH, Nordlingen (DE)

(72) Inventor: Markus Greither, Augsburg (DE)

(73) Assignee: HS ELEKTRONIK SYSTEME GMBH, Nordlingen (DE)

( * ) Notice: Subject to any disclaimer, the term of this patent is extended or adjusted under 35 U.S.C. 154(b) by 304 days.

(21) Appl. No.: 15/364,357

(22) Filed: Nov. 30, 2016

(65) Prior Publication Data

US 2017/0170656 A1 Jun. 15, 2017

(30) Foreign Application Priority Data

Dec. 11, 2015 (EP) ..................................... 15199559

(51) Int. Cl.
*H02J 3/00* (2006.01)
*H03K 17/687* (2006.01)
*H03K 17/13* (2006.01)
*H03K 17/0812* (2006.01)
*H02M 5/293* (2006.01)
*B64D 47/02* (2006.01)
(Continued)

(52) U.S. Cl.
CPC ................ *H02J 3/00* (2013.01); *B64D 47/02* (2013.01); *H02M 3/04* (2013.01); *H02M 5/293* (2013.01); *H03K 17/08122* (2013.01); *H03K 17/133* (2013.01); *H03K 17/6874* (2013.01); *H02M 1/08* (2013.01); *H03K 2217/0009* (2013.01)

(58) Field of Classification Search
CPC . H02J 3/00; B64D 47/02; H02M 3/04; H02M 5/293; H02M 1/08; H03K 17/08122; H03K 17/6874; H03K 17/133; H03K 2217/0009
See application file for complete search history.

(56) References Cited

U.S. PATENT DOCUMENTS

| 3,706,022 A | * | 12/1972 | Corey | ................ | H02M 3/3372 363/24 |
| 4,477,742 A | | 10/1984 | Janutka | | |
| 4,500,802 A | | 2/1985 | Janutka | | |

(Continued)

FOREIGN PATENT DOCUMENTS

CN 101882927 A * 11/2010 ............. H03K 17/56
EP 017497 A2 6/1996

OTHER PUBLICATIONS

European Search Report for Application No. 15199559.4-1804, dated Jul. 5, 2016. 11 pages.

*Primary Examiner* — Pinping Sun
(74) *Attorney, Agent, or Firm* — Cantor Colburn LLP

(57) ABSTRACT

Disclosed is a solid state power controller configured to supply electric power from an AC power supply to at least one load via at least one power distribution channel, the at least one power distribution channel comprising a primary solid state switching device and a secondary solid state solid state switching device connected in series. The solid state power controller includes a primary control terminal driver configured to supply a primary control voltage to the control terminal (G) of the primary solid state switching device with respect to a reference potential (R) and a secondary control terminal driver configured to supply a secondary control voltage to the control terminal (G) of the secondary solid state switching device.

13 Claims, 1 Drawing Sheet

(51) Int. Cl.
*H02M 3/04* (2006.01)
*H02M 1/08* (2006.01)

(56) References Cited

U.S. PATENT DOCUMENTS

| | | | | |
|---|---|---|---|---|
| 5,852,555 | A * | 12/1998 | Martin | H02M 3/285 363/71 |
| 6,407,937 | B2 * | 6/2002 | Bruckmann | H03K 17/0828 363/56.05 |
| 7,122,917 | B2 * | 10/2006 | Pfister | H02J 9/061 307/83 |
| 7,193,337 | B2 * | 3/2007 | Nguyen | H02M 5/2573 307/130 |
| 7,477,502 | B1 | 1/2009 | Faulkner | |
| 7,741,883 | B2 * | 6/2010 | Fuller | H03K 17/284 327/108 |
| 8,344,544 | B2 * | 1/2013 | Rozman | H02J 1/10 307/29 |
| 8,704,574 | B2 * | 4/2014 | Prabhuk | H02J 13/0003 327/202 |
| 8,847,656 | B1 * | 9/2014 | A | H03K 17/08122 327/310 |
| 9,444,363 | B1 * | 9/2016 | Deboy | H02M 7/217 |
| 9,553,574 | B2 * | 1/2017 | Brantl | H03K 17/167 |
| 9,748,060 | B2 * | 8/2017 | Klonowski | H01H 9/547 |
| 9,887,694 | B2 * | 2/2018 | Greither | H03K 17/122 |
| 2007/0268726 | A1 * | 11/2007 | Kojori | H02J 1/001 363/65 |
| 2011/0026285 | A1 * | 2/2011 | Kawashima | H02M 1/4208 363/127 |
| 2011/0260534 | A1 * | 10/2011 | Rozman | H02P 1/58 307/26 |
| 2012/0049935 | A1 * | 3/2012 | Greither | H03K 17/6871 327/534 |
| 2012/0153930 | A1 * | 6/2012 | Goto | H02M 1/08 323/311 |
| 2013/0140892 | A1 * | 6/2013 | Simper | H02J 4/00 307/31 |
| 2013/0252473 | A1 * | 9/2013 | Dickey | H01R 13/514 439/651 |
| 2013/0307514 | A1 * | 11/2013 | O'Connell | H03K 17/785 323/312 |
| 2013/0329329 | A1 * | 12/2013 | Liu | H02H 9/02 361/93.1 |
| 2014/0009189 | A1 | 1/2014 | Mauder | |
| 2014/0320194 | A1 * | 10/2014 | Rozman | H03K 17/167 327/382 |
| 2015/0364922 | A1 * | 12/2015 | Dickey | H02J 4/00 307/115 |
| 2016/0049868 | A1 * | 2/2016 | Pradier | B64D 47/00 307/9.1 |
| 2016/0344184 | A1 * | 11/2016 | Sundara Moorthy | H05B 33/0884 |
| 2017/0271904 | A1 * | 9/2017 | Ziv | H02J 7/0068 |
| 2019/0027930 | A1 * | 1/2019 | Balpe | H02J 1/12 |

* cited by examiner

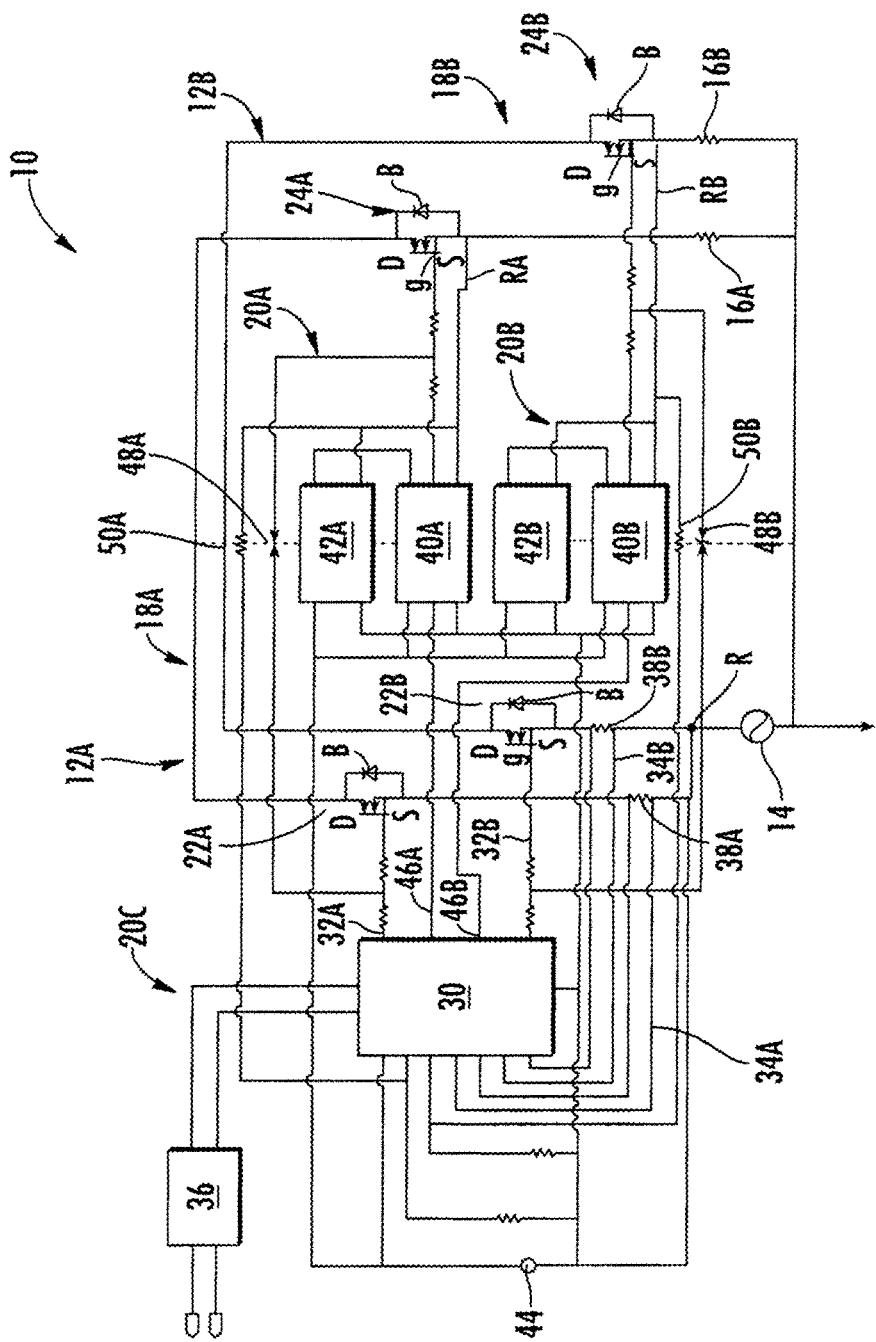

SOLID STATE POWER CONTROLLER

FOREIGN PRIORITY

This application claims priority to European Patent Application No. 15 199 559.4 filed Dec. 11, 2015, the entire contents of which is incorporated herein by reference.

BRIEF DESCRIPTION

The present invention relates to a solid state power controller (in the following referred to as SSPC) for distributing alternating current (AC) power.

Vehicles, such as aircraft, typically utilize one or more power distribution systems to distribute power from a primary power source to various vehicle systems. In aerospace, electrical power distribution SSPCs are used to switch the voltage from the power sources (e.g. generators or batteries) to the loads. Electronic AC switches are commonly used in place of mechanical relays to distribute power from the source to the load. A solid state power distribution system typically includes at least one electronic switching device, such as a field effect transistor (FET), and electronic circuitry that provides wiring protection. The electronic switching device and circuitry are usually built in semiconductor technology and therefore referred to as a solid state switching device ("SSSD") and solid state power controller ("SSPC"). SSPCs have found widespread use because of their desirable status capability, reliability, and packaging density. SSPCs are gaining acceptance as a modern alternative to the combination of conventional electromechanical relays and circuit breakers for commercial aircraft power distribution due to their high reliability, "soft" switching characteristics, fast response time, and ability to facilitate advanced load management and other aircraft functions.

Solid state power controllers for AC power typically include a pair of solid-state switching devices (SSSDs) connected in series with one another to form a power distribution channel. Each SSSD includes a control terminal and at least two controlled terminals. A control signal provided to the control terminal dictates whether the SSSD is in its ON operation mode or in its OFF operation mode. When the SSSD is in the ON operation mode, the SSSD allows power provided at a first controlled terminal to be supplied to a second controlled terminal. When the SSSD is in the OFF operation mode, the device prevents power provided at a first controlled terminal from being supplied to a second controlled terminal. However, most SSSDs are unidirectional, meaning that they allow current to flow in one direction even when in the OFF operation mode. For this reason, a solid-state AC SSSP requires a pair SSSDs connected in a back-to-back configuration to block both the positive half-cycle and negative half-cycle of the AC input power in a power distribution channel.

U.S. Pat. No. 4,500,802 discloses a solid state power controller including two metal oxide field effect transistors (MOSFETs) connected in series in a source-to-source configuration between first and a second main terminals connected to the drains of the MOSFETs, respectively. A constant current source is connected to the gate terminals of both MOSFETs and via a resistor to a point common to both source terminals of the MOSFETs such that the gate voltage for each MOSFET is the same regardless of the relative polarity of the voltage at the main terminals.

U.S. Pat. No. 4,477,742 discloses another solid-state power controller including two metal oxide field effect transistors (MOSFETs) connected in series in a drain-to-drain configuration between first and a second main terminals connected to the sources of the MOSFETs, respectively. A constant current source is connected to the gate terminals of both MOSFETs and via a resistor and a pair of diodes to the more negative of the main terminals as a reference voltage.

SSPCs are designed for a given current rating. An approach to provide more flexibility is to use paralleled SSPCs, which are configured such that the SSPC includes a plurality of power distribution channels connected in parallel. In such configuration the power distribution channels can be used stand-alone or in a paralleled configuration in which a number of power distribution channels share the load current, dependent on load requirements. This allows achieving larger current ratings using a plurality of power distribution channels having a lower current rating connected in parallel. When connecting a number of power distribution channels in parallel, normally each power distribution channel requires a floating power supply for the control and sense circuits, which must be isolated to any other power distribution channels on the same SSPC, even if powered from the same AC supply. Due to this, SSPCs cannot use synergies between channels. Moreover, typically significant hardware and/or real time features in software are required to allow zero-cross switching of paralleled AC SSPCs.

It is desirable to have a power distribution system which allows overcoming the above problems.

SUMMARY

Accordingly, embodiments as described herein include: A solid state power controller configured to supply electric power from an AC power supply to at least one load via at least one power distribution channel, the at least one power distribution channel comprising a primary solid state switching device and a secondary solid state solid state switching device connected in series. Each of the primary and secondary solid state switching devices has a first terminal, a second terminal, and a control terminal, the solid state switching device configured to switch between an OFF operation mode in which the second terminal is electrically disconnected from the first terminal, and an ON operation mode in which the second terminal is electrically connected to the first terminal, according to a control voltage applied to the control terminal. The solid state power controller further comprises a primary control terminal driver configured to supply a primary control voltage to the control terminal of the primary solid state switching device with respect to a reference potential; and a secondary control terminal driver configured to supply a secondary control voltage to the control terminal of the secondary solid state switching device.

In particular, the power distribution system and the solid state power controller module may be configured for managing and distributing AC power in an aircraft. Embodiments also provide an aircraft comprising the power distribution system.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawing in which:

FIG. 1 is a simplified circuit diagram of an AC SSPC for a power distribution system, where the AC SSPC comprises two paralleled power distribution channels, according to an embodiment of the present invention.

DETAILED DESCRIPTION

FIG. 1 shows a schematic of a solid state power controller (in the following: SSPC) for switching an alternating current power supply (in the following the term AC is used to denote an alternating current) in a power distribution system. The AC SSPC 10 comprises two paralleled power distribution channels 12A, 12B connected in parallel between a common AC power supply 14 and respective loads 16A, 16B. The AC SSPC 10 distributes AC power from electrical power supply 14 to the loads 16A, 16B. The power supply may be any kind of AC power supply, e.g. a 115V/400 Hz AC power supply as commonly used in aircraft. It is to be understood that the number of power distribution channels connected parallel is not limited to two, but may be any number as desired to achieve a desired current rating. In FIG. 1 two loads 16A, 16B are indicated schematically. It is to be understood that the loads 16A, 16B may be one load common to the paralleled power distribution channels 12A, 12B. Moreover, although the loads 16A, 16B are indicated to be resistive loads, the loads 16A, 16B may have any characteristics, like resistive, capacitive, and/or inductive characteristics.

The power distribution channels 12A, 12B include power sections 18A, 18B and sense and control sections 20A, 20B. Power section 18A is assigned to the first power distribution channel 12A. Power section 18B is assigned to the second power distribution channel 12B. The power section 18A assigned to the first power distribution channel 12A comprises a pair of first solid state switching devices (SSSDs) 22A, 24A connected in series between the power supply 14 and the load 16A. The power section 18B assigned to the second power distribution channel 12B comprises a pair of second solid state switching devices (SSSDs) 22B, 24B connected in series between the power supply 14 and the load 16B. The pair of first solid state switching devices 22A, 24A of the first power distribution channel 12A comprises a primary solid state switching device 22A and a secondary solid state switching device 24A. In the same way, the pair of second solid state switching devices 22B, 24B of the second power distribution channel 12B comprises a primary solid state switching device 22B and a secondary solid state switching device 24B. Each of the pairs of solid state switching devices 22A, 24A, 22B, 24B may be switched between an ON operation mode of the respective pair of solid state switching devices 22A, 24A or 22B, 24B and an OFF operation mode of the respective pair of solid state switching devices 22A, 24A or 22B, 24B. In the ON operation mode of the respective pair of solid state switching devices 22A, 24A or 22B, 24B the supply voltage provided by power supply 14 is electrically connected to the respective load 16A or 16B. In the OFF operation mode of the respective pair of solid state switching devices 22A, 24A or 22B, 24B the supply voltage provided by power supply 14 is disconnected from the respective load 16A, 16B.

The SSSDs 22A, 24A, 22B, 24B may be based on any known semiconductor technology used for production of power switching devices. In one example, SSSDs 22A, 22B, 24A, 24B may have the configuration of field effect transistors. A particular embodiment of a field effect transistor is a Si-MOSFET (metal oxide semiconductor field effect transistor). The Si-MOSFET transistor may be made in NMOS technology. Other configurations are conceivable for the SSSD switching devices 22A, 22B, 24A, 24B as well, particularly any other kind of switching devices or transistors based on Si technology. Moreover, the SSSDs 22A, 24A, 22B, 24B may be any kind of bipolar transistor (e.g. a JFET) or unipolar transistor (e.g. a FET or an IGBT). The paralleled power distribution design suggested herein may be beneficial for power distribution systems based on other types of SSSD's as well, particularly for SiC based switching devices or transistors like SiC-MOSFET's or SiC-IGBT's. SiC FET's have turned out to be particularly sensitive with respect to thermal loads induced by temperatures increasing above a nominal temperature.

Each of the SSSDs 22A, 24A, 22B, 24B includes a first terminal (in FIG. 1 the SSSDs are MOSFETs, so the first terminal is referred to as drain D), a second terminal (in the MOSFETs of FIG. 1: source S), and a control terminal (in the MOSFETs of FIG. 1: gate G). Depending on a control voltage applied to the control terminal (gate G) with respect to the second terminal (source S), an electrical path between the first terminal (drain D) and the second terminal (source S)—in the following referred to as "source-drain path"—will be open (ON condition), or closed (OFF condition). When the source-drain path of the SSSD 22A, 24A, 22B, 24B is in the ON condition, usually the source-drain path will be fully open (e.g. the electrical resistance of the source-drain path will be at a minimum), and the SSSD 22A, 24A, 22B, 24B operates in the ON operation mode. When the source-drain path of the SSSD 22A, 24A, 22B, 24B is in the OFF condition, the source-drain path will be closed (e.g. the electrical resistance of the source-drain path will be very large, or even infinity) and the SSSD 22A, 24A, 22B, 24B operates in the OFF operation mode.

As indicated by B in FIG. 1, each of the SSSDs 22A, 24A, 22B, 24B includes an intrinsic body diode. In FIG. 1 the intrinsic body diode is indicated as a diode B connected in parallel to the source-drain path of the respective SSSD 22A, 24A, 22B, 24B. The body diode B is connected in conducting direction when the electric potential of the first terminal (drain D) is negative with respect to the electric potential of the second terminal (source S). Because of the body diode B, SSSDs 22A, 24A, 22B, 24B are unidirectional devices which are able to disconnect the second terminal (source S) from the first terminal (drain D) only with respect to one polarity of the electric power (i.e. when the first terminal D is positive with respect to the second terminal S). With respect to the other polarity of electric power (i.e. when the first terminal D is negative with respect to the second terminal S), the body diode B is conducting, thus connecting the first terminal (drain D) to the second terminal (source S) regardless of the control voltage applied to the control terminal (gate G). Therefore, in order to switch between the ON operation mode and the OFF operation mode with respect to electric power from AC power supply 14, each power distribution channel 12A, 12B comprises a pair of a primary SSSD 22A and a secondary SSSD 24A (first power distribution channel 12A) or a primary SSSD 22B and a secondary SSSD 24B (second power distribution channel 12B). In each power distribution channel, the primary SSSD 22A/22B and the secondary SSSD 24A/24B are connected in series in a back-to-back configuration, i.e. the body diodes of the primary SSSD 22A or 22B is directed in opposite direction to the body diode of the secondary SSSD 24A or 24B. In FIG. 1, the primary SSSD 22A of the first power distribution channel 12A is connected such that the first terminal (drain D) of the primary SSSD 22A is connected to the first terminal (drain D) of the secondary SSSD 24A ("drain to drain configuration"). The primary SSSD 22B of the second power distribution channel 12B is connected such that the first terminal (drain D) of the primary SSSD 22B is connected to the first terminal (drain D) of the secondary SSSD 24B ("drain to drain configuration").

The second terminal (source S) of primary SSSD 22A or 22B is connected to the power supply 14 via a shunt resistor 26A or 26B. Therefore, the second terminal (source S) of primary SSSD 22A or 22B has the electric potential of the power supply 14 or an electric potential having a fixed relation to the electric potential of the power supply 14 (as determined by shunt resistor 26A or 26B). The second terminal (source S) of the primary SSSD 22A or 22B rides on the voltage of the power supply 14. Therefore, a reference potential R for generating respective control voltages to be applied to the control terminals (gate G) of the primary SSSDs 22A and 22B of the first and second power distribution channels is defined by power supply 14. The second terminal (source S) of primary SSSD 22A or 22B is connected to the reference potential via the shunt resistor 26A or 26B. The first terminal (drain D) of secondary SSSD 24A or 24B is connected to the load 16A or 16B.

Further, each power distribution channel 12A, 12B includes a sense and control section section 20A, 20B for controlling ON/OFF operation modes of the respective pairs of primary SSSD 22A or 24A and secondary SSSD 22B or 24B. FIG. 1 schematically shows the power sections 18A, 18B and the sense and control sections 20A, 20B of the power distribution channels 12A, 12B, as far as relevant to the present invention. Other parts of the SSPC 10 are not shown for sake of clarity.

While there are separate power sections 18A and 18B for each power distribution channel 12A and 12B, the first and second power distribution channels 12A and 12B to a significant portion share a common sense and control section 20C. The shared sense and control section portion 20C mainly relates to the control of the primary SSSDs 22A and 22B of the first and second power distribution channels 12A and 12B, while the secondary SSSDs 24A and 24B of the first and second power distribution channels 12A and 12B are controlled by separate sense and control section portions 20A and 20B.

The control terminals (gate G) of each primary SSSD 22A and 22B are connected to respective primary control terminal drivers. In FIG. 1, the primary control terminal drivers for both primary SSSDs 22A and 22B are provided by a same control device 30. In the embodiment shown control device 30 is a microcontroller. Microcontroller 30 is referenced to common reference potential R via lines 34A and 34B, and provides primary control terminal control signals for the primary SSSDs 22A and 22B of the first and second power distribution channels 12A and 12B on lines 32A and 32B, respectively.

In the following description, the control terminal of one of the primary SSSDs 22A, 22B will be referred to as gate G, the first terminal will be referred to as the drain D, and the second terminal will be referred to as the source S, corresponding to the usual designations for a field effect transistor. It is to be understood that other designations might be used in case the SSSDs have another configuration (e.g. base, emitter and collector in case of a bipolar transistor).

The primary gate drivers provided by microcontroller 30 are configured to control an electrical potential of the gate G of the respective primary SSSD 22A, 22B. Depending on the electric potential of the gate G, the source-drain path of the primary SSSD 22A, 22B will be conductive, thereby electrically connecting the drain D with the source S of the primary SSSD 22A, 22B ("ON" operation mode of the SSSD), or non-conductive, thereby isolating the drain D from the source S of the primary SSSD 22A, 22B ("OFF" operation mode of the SSSD). The primary SSSDs 22A, 22B are configured to switch between ON operation mode and OFF operation mode based on commands supplied to the primary gate drivers, e.g. from a higher order control unit via respective interfaces, as indicated by 36 in FIG. 1.

Each of the power distribution channels 12A and 12B includes a load current detecting unit for detecting a load current provided by the power distribution channel 12A, 12B, respectively. In the embodiment shown, each of the load current detecting units is configured to detect a voltage across a shunt resistor 38A, 38B connected serially in the power distribution channel 12A, 12B, e.g. in between the power supply 14 and the source S of the respective primary SSSD 22A, 22B. In the embodiment shown the load current signal is a voltage signal indicative of the load current. The voltage signal is detected by control device 30.

The control terminals (gates G) of each secondary SSSD 24A and 24B are connected to respective secondary control terminal drivers 40A and 40B. Separate secondary control terminal drivers 40A, 40B are used to control the electric potential of the control terminal G of the secondary SSSD 24A of the first power distribution channel 12A, on the one hand, and to control the electric potential of the control terminal G of the secondary SSSD 24B of the second power distribution channel 12B, on the other hand. Each of the secondary control terminal drivers 40A and 40B is supplied by its own secondary power supply 42A and 42B. Each of the secondary control terminal drivers 40A and 40B is electrically isolated with respect to other devices of the SSPC 10, particularly with respect to the power supply 14. Also the secondary power supplies 42A and 42B are isolated with respect to other devices of the SSPC 10, particularly with respect to the power supply 14. Isolated secondary power supplies 42A and 42B are supplied by an isolated DC power supply 44. Isolated DC power supply may e.g. be realized as an isolated DC/DC converter on the SSPC 10. Isolated secondary power supplies 42A and 42B may have a relatively simple configuration, as the power requirements are much lower than for conventionally known isolated SSPCs. For example, isolated secondary power supplies 42A, 42B may have a charge pump configuration or may be simple transformer based power supplies.

The first isolated secondary control terminal driver 40A controls electrical potential of the control terminal G of the secondary SSSD 24A of the first power distribution channel 12A with respect to the electrical potential at the second terminal (source S) of the secondary SSSD 24A of the first power distribution channel 12A as a first reference potential RA. The second isolated secondary control terminal driver 40B controls electrical potential of the control terminal G of the secondary SSSD 24B of the second power distribution channel 12B with respect to the electrical potential at the second terminal (source S) of the secondary SSSD 24B of the second power distribution channel 12B as a second reference potential RB. Each of the secondary control terminal drivers 40A, 40B may have the configuration of a single channel isolated gate drive IC, and therefore have a relatively simple configuration.

In the following description, the control terminal of the secondary SSSDs 24A, 24B will be referred to as gate G, the first terminal will be referred to as the drain D, and the second terminal will be referred to as the source S, corresponding to the usual designations for a field effect transistor. It is to be understood that other designations might be used in case the SSSDs have another configuration (e.g. base, emitter and collector in case of a bipolar transistor).

The secondary gate drivers 40A, 40B are configured to control an electrical potential of the gate G of the respective secondary SSSD 24A, 24B. Depending on the electric potential of the gate G, the source-drain path of the secondary SSSD 24A, 24B will be conductive, thereby electrically connecting the drain D with the source S of the secondary SSSD 24A, 24B ("ON" operation mode of the SSSD), or non-conductive, thereby isolating the drain D from the source S of the primary SSSD 24A, 24B ("OFF" operation mode of the SSSD). The secondary SSSDs 24A, 24B are configured to switch between ON operation mode and OFF operation mode based on commands supplied to the secondary gate drivers 40A, 40B.

The secondary gate drivers 40A and 40B control the gate potentials of the secondary SSSDs 24A, 24B independently. Particularly, each of the secondary gate drivers 40A, 40B controls the gate potential of the respective secondary SSSD 24A, 24B independent of the gate potentials of the primary SSSDs 22A, 22B. However, the control device 30 is connected via lines 46A and 46B to each of the secondary gate drivers 40A, 40B. Thereby, the control device 30 provides control signals to the secondary gate drivers 40A, 40B for switching the secondary SSSDs 24A, 24B between the ON operation mode and the OFF operation mode. The control device 30 may coordinate operation of the primary SSSD 22A and the secondary SSSD 24A of the first power distribution channel 12A. In the same way, the control device 30 may coordinate operation of the primary SSSD 22B and the secondary SSSD 24B of the first power distribution channel 12B. The control device 30 may have the function of a master controller controlling the gate potentials of the primary SSSDs 22A, 22B, as well as controlling the gate potentials of the secondary SSSDs 24A, 24B via the secondary gate drivers 40A, 40B acting as slave controllers. Nevertheless, the control device 30 may provide control signals to the secondary gate drivers 40A, 40B for operating the secondary SSSDs in an operation mode different from the operation mode of the respective primary SSSDs. Independent control of the primary SSSDs 22A, 22B and the secondary SSSDs 24A, 24B of each power distribution channel 12A, 12B enables to use the body diodes B of the SSSDs for properly detecting zero voltage crossings and zero current crossings. This allows the control device 30 to detect in which half cycle of the AC current a respective SSSD 22A, 22B, 24A, 24B is and to control the gate potentials of the SSSDs 22A, 22B, 24A, 24B such as to provide voltage zero-cross on-switching and current zero-cross off-switching. Switching of the SSSDs 22A, 24A, 22B, 24B to their on/off conditions can be effected in the correct sequence by software. In order to allow the control device 30 to detect the voltage at the actually conducting SSSD 22A, 24A or 22B, 24B of a respective power distribution channel 12A, 12B, a measurement resistor 50A, 50B is connected in between the source S of the secondary SSSD 24A, 24B, and the control device 30. The measurement resistor 50A, 50B is referenced to the negative terminal of the isolated DC power supply 44.

Each of the power distribution channels 12A, 12B comprises an active clamping device 48A, 48B for protecting the SSSDs 22A, 24A or 22B, 24B of the respective power distribution channel 12A, 12B against overvoltage. The active clamping devices 48A, 48B have the configuration of a bidirectional avalanche diode being configured to experience avalanche breakdown at a specified reverse bias voltage. The active clamping device may e.g. be a bidirectional Zener diode or a bidirectional TVS diode. Alternatively, a combination of unidirectional avalanche diodes connected in such way that bidirectional avalanche functionality is provided, may be used as an active clamping device. The first power distribution channel 12A comprises a first active clamping device 48A connected in between the gate G of the primary SSSD 22A and the gate of the gate G of the secondary SSSD 24A. Thereby, the first active clamping device 48A detects a voltage difference between the gates G of the primary and secondary SSSD 28A. Since at any given time, one of the SSSDs 22A, 24A will be operated in the ON operation mode and the other one of the SSSDs 22A, 24A will be operated on the OFF operation mode, the voltage difference across the avalanche device 48A is approximately equal to the voltage difference between the drain D and source S of the one of the primary SSSD 22A and secondary SSSD 24A operating in the OFF operation mode at a given time. In case the voltage difference across the active clamping device 48A exceeds the specified reverse bias voltage of the active clamping device 48, the active clamping device 48A starts avalanching thereby driving the gate G of the blocked SSSD 22A, 24A such as to switch the blocked SSSD 22A, 24A into its ON operation mode. Since at any given time either the primary SSSD 22A or the secondary SSSD 22B is operated in the OFF operation mode, the active clamping device 48A needs to have bidirectional avalanching functionality. The same description applies with respect to the second active clamping device 48B connected in the second power distribution channel 12B in between the gate G of the primary SSSD 22B and the gate of the secondary SSSD 24B.

Embodiments as described herein provide for a solid state power controller configured to supply electric power from an AC power supply to at least one load via at least one power distribution channel, the at least one power distribution channel comprising a primary solid state switching device and a secondary solid state switching device connected in series. Each of the primary and secondary solid state switching devices has a first terminal, a second terminal, and a control terminal, the solid state switching device configured to switch between an OFF operation mode in which the second terminal is electrically disconnected from the first terminal, and an operation mode in which the second terminal is electrically connected to the first terminal, according to a control voltage applied to the control terminal. The solid state power controller comprises a primary control terminal driver configured to supply a primary control voltage to the control terminal of the primary solid state switching device with respect to a reference potential; and a secondary control terminal driver configured to supply a secondary control voltage to the control terminal of the secondary solid state switching device. Particularly, provision of separate primary control terminal drivers and secondary control terminal drivers allows providing the secondary control voltage independent of the primary control voltage.

The electric path between the first terminal and the second terminal of the semi-conductor switching device (also referred to as "SSSD") is referred to as "source-drain path" of the SSSD throughout this disclosure. This denotation is typically used in connection with field effect transistors, however it be understood that the term "source-drain path" as used herein applies to other types of SSSDs as well (e.g. to bipolar transistors where the terms "emitter" and "collector" are commonly used instead of "source" and "drain").

The solid state switching device may comprise a field effect transistor, particularly a metal oxide semiconductor field effect transistor (MOSFET). For example, the field effect transistor may comprise a Si field effect transistor. With a field effect transistor, the first terminal will be drain, the second terminal will be source, and the control terminal will be gate. Drain may be connected to the supply voltage and source may be connected to the load circuit. A field effect transistor features easy control. Moreover, MOSFETs have a resistive conduction nature, and a positive temperature coefficient. To increase the current carrying capability and reduce the voltage drop or power dissipation, the SSSD may comprise multiple MOSFETs generally connected in parallel.

In some embodiments, the field effect transistor may comprise a SiC field effect transistor as a basic solid state component for building up the solid state switching device. SiC based SSSDs can be operated at elevated temperatures up to 175° C. Junction Temperature and for switching high line input voltages up to 1200 V.

The SSPC may be used for switching AC loads. Typical supply voltages may include 115 VAC or 230 VAC. Maximum currents in the load circuit to be switched may include 5 A; 10 A; 15 A; and may be as high as 45 A.

Connecting the primary and secondary SSSDs of a power distribution channel in a "drain-to-drain" configuration, in which the first terminal of the primary SSSD is connected to the first terminal of the secondary SSSD, allows connecting the primary SSSD to a control referenced to the AC power supply, if desired through a shunt resistor. In such configuration multiple power distribution channels can be combined when connected to same AC power supply. The secondary control terminal driver allows for controlling the electric potential of the control terminal of the secondary SSSD in each channel independently of the electric potential of the control terminal of the primary SSSD. Newly emerging isolated gate driver integrated circuits (ICs) can be used as the secondary control terminal driver to drive the control terminal of the secondary SSSD. The additional circuitry is not very complex and can be configured using only a small circuit. Independent control of the primary and secondary SSSD enables to use the SSSD body diodes for clean zero cross switching when the SSSDs are turned on/off in the correct sequence by software. In such configuration, often 100 μs-300 μs real time performance is sufficient. In contrast, conventional approaches require about 1-10 μs real time performance. In particular no application specific ASICS are required, as the ICs for driving the primary control terminals and secondary control terminals can be standard ICs.

The design suggested herein allows providing multiple power distribution channels operating with respect to the same reference potential, in particular all operating with respect to the power supply as the same reference potential. As the primary SSSDs in each power distribution channel may use the same control device for controlling the electric potential of their control terminals, number of parts is reduced and less space required for the SSPC. Finally, independent operation of the primary and secondary SSSD allows utilizing the body diodes of the SSSDs to achieve good voltage zero cross switching on turn-on and current zero cross switching on turn-off with relaxed software real time requirements to reduce clock speed and or power consumption.

Particular embodiments may include any of the following optional features, alone or in combination, unless specified otherwise:

The first terminal of the primary solid state switching device may be connected to the first terminal of the secondary solid state switching device, thereby providing a "drain-to-drain" configuration.

The second terminal of the primary solid state switching device may be connected to the reference potential.

In particular embodiments, the reference potential may be the AC power supply or may be an electric potential derived from the AC power supply. E.g. the reference potential may be derived by a voltage drop when feeding the AC power supply across a shunt resistor.

In particular embodiments, the solid state power controller as described above further may comprise a control device connected to the reference potential, the control device configured to provide the primary control terminal driver.

Particularly, the secondary control terminal driver may be electrically isolated from the primary control terminal driver. Moreover, in some embodiments, the secondary control terminal driver may be configured to supply the secondary control voltage to the control terminal of the secondary solid state switching device based on a control signal received from the primary control terminal driver.

The secondary control terminal driver may be configured to supply the secondary control voltage to the control terminal of the secondary solid state switching device with respect to a secondary reference potential. The secondary reference potential may correspond to an electric potential of the second terminal of the secondary semiconductor switching device.

In particular embodiments, the solid state power controller as described herein further may comprise an isolated power supply configured to supply power to the secondary control terminal driver.

In particular embodiments, the solid state power controller as described herein further may comprise an overvoltage clamping device configured to restrict the voltage between the first and second terminals of the primary and secondary semiconductor switching devices to a predetermined maximum value. In particular, the overvoltage clamping device may be configured to determine a voltage difference between the control terminal of the primary semiconductor switching device and the control terminal of the secondary semiconductor switching device.

Moreover, in particular embodiments the solid state power controller described herein may be configured to determine a voltage zero crossing for switching the solid state switching devices of the at least one power channel from the OFF operation mode to the ON operation mode and/or to determine a current zero crossing for switching the solid state switching devices of the at least one power channel from the ON operation mode to the OFF operation mode using the secondary solid state switching device. For example, the solid state power controller may be configured to detect a voltage drop across a measurement resistor connecting the second terminal of the secondary semiconductor switching device and a reference potential of the isolated power supply for the secondary solid state switching device.

Determining a zero voltage crossing for switching the solid state switching devices of the at least one power channel from the OFF operation mode to the ON operation mode allows to minimize high inrush currents in case of capacitive loads. Determine a zero current crossing for switching the solid state switching devices of the at least one power channel from the ON operation mode to the OFF operation mode allows to minimize energy to be dissipated from inductive loads when switching the inductive loads off.

Moreover, the solid state power controller as described herein further may comprise at least two power distribution channels connected in parallel. In such paralleled configuration, the control device may be configured to provide the primary control signals to the primary control terminal of each power distribution channel.

Moreover, the secondary control terminal driver of each power distribution channel may be supplied by a respective isolated control driver power supply.

In further embodiments, the at least one power distribution channel may comprise a load current detection unit configured to detect an electrical current from the first terminal to the second terminal of the solid state switching devices of the at least one power distribution channel. Particularly, the load current detection unit may comprise a current detection resistor connected in series to the primary and secondary semiconductor switching devices of the at least one power distribution channel. Particularly, the load current detection resistor may be connected between a power supply and the second terminal of the first solid state switching device.

The power distribution system may be configured for managing and distributing electric power in an aircraft. Therefore, embodiments disclosed herein may also relate to an aircraft comprising the power distribution system described herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A solid state power controller configured to supply electric power from an AC power supply to at least one load via at least one power distribution channel, the at least one power distribution channel comprising a primary solid state switching device and a secondary solid state solid state switching device connected in series;
   each of the primary and secondary solid state switching devices having a first terminal (D), a second terminal (S), and a control terminal (G), each of the primary and secondary solid state switching devices configured to switch between an OFF operation mode in which the second terminal (S) is electrically disconnected from the first terminal, and an ON operation mode in which the second terminal (S) is electrically connected to the first terminal (D), according to a control voltage applied to the control terminal (G);
   wherein the solid state power controller comprises:
      a primary control terminal driver configured to supply a primary control voltage to the control terminal (G) of the primary solid state switching device with respect to a reference potential (R); and
      a secondary control terminal driver configured to supply a secondary control voltage to the control terminal (G) of the secondary solid state switching device;
   wherein the secondary control terminal driver is electrically isolated from the primary control terminal driver; and
   wherein the secondary control terminal driver is configured to supply the secondary control voltage to the control terminal (G) of the secondary solid state switching device based on a control signal provided by the primary control terminal driver.

2. The solid state power controller according to claim 1, wherein the first terminal (D) of the primary solid state switching device is connected to the first terminal (D) of the secondary solid state switching device.

3. The solid state power controller according to claim 1, wherein the second terminal (S) of the primary solid state switching device is connected to the reference potential (R).

4. The solid state power controller according to claim 1, wherein the reference potential (R) is the AC power supply or derived from the AC power supply.

5. The solid state power controller according to claim 1, further comprising a control device connected to the reference potential (R), the control device configured to provide signals to the primary control terminal driver.

6. The solid state power controller according to claim 1, wherein the secondary control terminal driver is configured to supply the secondary control voltage to the control terminal (G) of the secondary solid state switching device with respect to a secondary reference potential (RA, RB), the secondary reference potential (RA, RB) corresponding to an electric potential of the second terminal (S) of the secondary semiconductor switching device.

7. The solid state power controller according to claim 1, further comprising an isolated power supply configured to supply the electric power to the secondary control terminal driver.

8. The solid state power controller according to claim 1, further comprising an overvoltage clamping device configured to restrict a voltage between the first and second terminals (S, D) of the primary and secondary semiconductor switching devices to a predetermined maximum value.

9. The solid state power controller according to claim 8, wherein the overvoltage clamping device is configured to determine a voltage difference between the control terminal (G) of the primary semiconductor switching device and the control terminal (G) of the secondary semiconductor switching device.

10. The solid state power controller according to claim 1, being configured to determine a voltage zero crossing for switching the primary and secondary solid state switching devices of the at least one power distribution channel from the OFF operation mode to the ON operation mode using the secondary solid state switching device and/or to determine a current zero crossing for switching the primary and secondary solid state switching devices of the at least one power channel from the ON operation mode to the OFF operation mode using the secondary solid state switching device.

11. The solid state power controller according to claim 1, further comprising at least two power distribution channels connected in parallel.

12. The solid state power controller according to claim 11, further comprising a control device connected to the reference potential (R), the control device configured to provide signals to the primary control terminal driver, wherein the control device is configured to provide primary control signals to the primary control terminal (G) of each of the at least two power distribution channels.

13. The solid state power controller according to claim 1, wherein the secondary control terminal driver of each of the at least one power distribution is supplied by a respective isolated control driver power supply.

* * * * *